US011862224B2

(12) United States Patent
Hsieh et al.

(10) Patent No.: US 11,862,224 B2
(45) Date of Patent: Jan. 2, 2024

(54) METHOD FOR PERFORMING MEMORY CALIBRATION, ASSOCIATED SYSTEM ON CHIP INTEGRATED CIRCUIT AND NON-TRANSITORY COMPUTER-READABLE MEDIUM

(71) Applicant: Realtek Semiconductor Corp., HsinChu (TW)

(72) Inventors: Tse-Yi Hsieh, HsinChu (TW); Ting-Ying Wu, HsinChu (TW); Shu-Min Wu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 142 days.

(21) Appl. No.: 17/515,571

(22) Filed: Nov. 1, 2021

(65) Prior Publication Data

US 2022/0238149 A1 Jul. 28, 2022

Related U.S. Application Data

(60) Provisional application No. 63/140,255, filed on Jan. 22, 2021.

(30) Foreign Application Priority Data

May 28, 2021 (TW) ................................ 110119417

(51) Int. Cl.
*G11C 29/00* (2006.01)
*G11C 11/4072* (2006.01)
(Continued)

(52) U.S. Cl.
CPC ...... *G11C 11/4072* (2013.01); *G11C 11/4093* (2013.01); *G11C 11/4096* (2013.01); *G11C 29/10* (2013.01); *G11C 29/022* (2013.01)

(58) Field of Classification Search
CPC ............ G11C 11/4072; G11C 11/4093; G11C 11/4096; G11C 29/10; G11C 29/022
See application file for complete search history.

(56) References Cited

U.S. PATENT DOCUMENTS 7,036,053 B2 * 4/2006 Zumkehr ............. G11C 7/1051
714/719
2006/0227912 A1 * 10/2006 Leibowitz ............... H04L 1/244
375/350

(Continued)

*Primary Examiner* — Mushfique Siddique
(74) *Attorney, Agent, or Firm* — Winston Hsu

(57) ABSTRACT

A method for performing memory calibration and an associated System on Chip (SoC) Integrated Circuit (IC) are provided. The method may include: in a power-up and initialization phase, controlling a physical layer (PHY) circuit within the SoC IC to apply power to a memory through a pad set and perform initialization on the memory; in an impedance-calibration-related phase, triggering the memory to perform impedance calibration regarding a set of data pins; in at least one subsequent phase, during performing any calibration operation among a reading-related calibration operation and a writing-related calibration operation, performing a data access test corresponding to a set of test points on a predetermined mask, wherein the predetermined mask is movable with respect to a data eye; and according to whether the data access test is successful, selectively stopping the any calibration operation.

8 Claims, 10 Drawing Sheets

(51) Int. Cl.
*G11C 11/4096* (2006.01)
*G11C 11/4093* (2006.01)
*G11C 29/10* (2006.01)
*G11C 29/02* (2006.01)

(56) References Cited

U.S. PATENT DOCUMENTS

| | | | | |
|---|---|---|---|---|
| 2011/0075496 | A1* | 3/2011 | Mueller | G11C 29/022 |
| | | | | 365/194 |
| 2013/0064025 | A1* | 3/2013 | Chen | G06F 13/1689 |
| | | | | 365/193 |
| 2014/0047158 | A1* | 2/2014 | Frans | G06F 3/0658 |
| | | | | 711/102 |
| 2014/0181429 | A1* | 6/2014 | Malladi | G06F 11/0751 |
| | | | | 711/154 |
| 2016/0035411 | A1* | 2/2016 | Yu | G11C 11/4076 |
| | | | | 365/189.07 |
| 2020/0133542 | A1* | 4/2020 | Kim | G06F 3/0673 |
| 2021/0072910 | A1* | 3/2021 | Koizumi | G11C 29/50008 |

* cited by examiner

METHOD FOR PERFORMING MEMORY CALIBRATION, ASSOCIATED SYSTEM ON CHIP INTEGRATED CIRCUIT AND NON-TRANSITORY COMPUTER-READABLE MEDIUM

CROSS REFERENCE TO RELATED APPLICATIONS

This application claims the benefit of U.S. provisional application No. 63/140,255, which was filed on Jan. 22, 2021, and is included herein by reference.

BACKGROUND OF THE INVENTION

1. Field of the Invention

The present invention relates to external memory control of an integrated circuit (IC), and more particularly, to a method for performing memory calibration, an associated system on chip (SoC) IC and a non-transitory computer-readable medium.

2. Description of the Prior Art

According to the related art, when an electronic device equipped with a dynamic random access memory (DRAM) is powered up, the DRAM may need to undergo preparation operations corresponding to multiple preparation phases to enter a state of ready-for-use. For better comprehension, the multiple preparation phases may include a first phase related to initialization, another phase related to resistor/impedance-calibration, and one or more subsequent phases. However, some problems may occur. For example, parameter calibration in the one or more subsequent phases may be time-consuming, such that the boot time of the electronic device is increased, which may cause a bad user experience. However, without the parameter calibration, it is difficult to ensure a normal operation of the electronic device. Thus, a novel method and associated architecture for realizing SoC IC equipped with reliable calibration mechanism without (or less likely) introducing side effects are required.

SUMMARY OF THE INVENTION

It is therefore an objective of the present invention to provide a method for performing memory calibration, an associated SoC IC and a non-transitory computer-readable medium, in order to solve the above-mentioned problems.

It is another objective of the present invention to provide a method for performing memory calibration, an associated SoC IC and a non-transitory computer-readable medium, in order to reduce the boot time of the electronic device and bring a better user experience.

At least one embodiment of the present invention provides a method for performing memory calibration, where the method is applicable to a system on chip (SoC) integrated circuit (IC). The method may comprise: in a power-up and initialization phase of the SoC IC, controlling a physical layer (PHY) circuit within the SoC IC to apply power to a memory through a pad set and perform initialization on the memory; in an impedance-calibration-related phase of the SoC IC, triggering the memory to perform impedance calibration regarding a set of data pins; in at least one subsequent phase of the SoC IC, during performing any calibration operation among a reading-related calibration operation and a writing-related calibration operation, performing a data access test corresponding to a set of test points on a predetermined mask, wherein the predetermined mask is movable with respect to a data eye; and according to whether the data access test is successful, selectively stopping the any calibration operation.

At least one embodiment of the present invention provides a SoC IC, where the SoC IC is equipped with a memory calibration function. The SoC IC may comprise: a processing circuit, configured to control operations of the SoC IC; a physical layer (PHY) circuit, coupled to the processing circuit, configured to communicate with a memory for the processing circuit; and a pad set, comprising a plurality of pads as terminals of the SoC IC for coupling the SoC IC to at least one external component, wherein the at least one external component comprises the memory. For example, in a power-up and initialization phase of the SoC IC, the processing circuit controls the PHY circuit within the SoC IC to apply power to the memory through the pad set and perform initialization on the memory; in an impedance-calibration-related phase of the SoC IC, the processing circuit triggers the memory to perform impedance calibration regarding a set of data pins; in at least one subsequent phase of the SoC IC, during performing any calibration operation among a reading-related calibration operation and a writing-related calibration operation, the processing circuit performs a data access test corresponding to a set of test points on a predetermined mask, wherein the predetermined mask is movable with respect to a data eye; and according to whether the data access test is successful, the processing circuit selectively stops the any calibration operation.

At least one embodiment of the present invention provides a non-transitory computer-readable medium storing a program code which causes a SoC IC to perform a memory calibration procedure when executing the program code. The memory calibration procedure may comprise: in a power-up and initialization phase of the SoC IC, controlling a physical layer (PHY) circuit within the SoC IC to apply power to a memory through a pad set and perform initialization on the memory; in an impedance-calibration-related phase of the SoC IC, triggering the memory to perform impedance calibration regarding a set of data pins; in at least one subsequent phase of the SoC IC, during performing any calibration operation among a reading-related calibration operation and a writing-related calibration operation, performing a data access test corresponding to a set of test points on a predetermined mask, wherein the predetermined mask is movable with respect to a data eye; and according to whether the data access test is successful, selectively stopping the any calibration operation.

One of the advantages of the present invention is that through a carefully designed memory calibration mechanism, the present invention can efficiently perform memory calibration to reduce the boot time of the electronic device and bring better user experience. In comparison with the related art, the present invention can prevent using a time-consuming scanning method during calibration (e.g., testing with respect to all possible parameter combinations). In addition, the present invention can realize a system-on-chip integrated circuit with a reliable calibration mechanism without (or less likely) introducing side effects.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 illustrates a scanning calibration control scheme in the upper half thereof.

DETAILED DESCRIPTION

Figure 1:
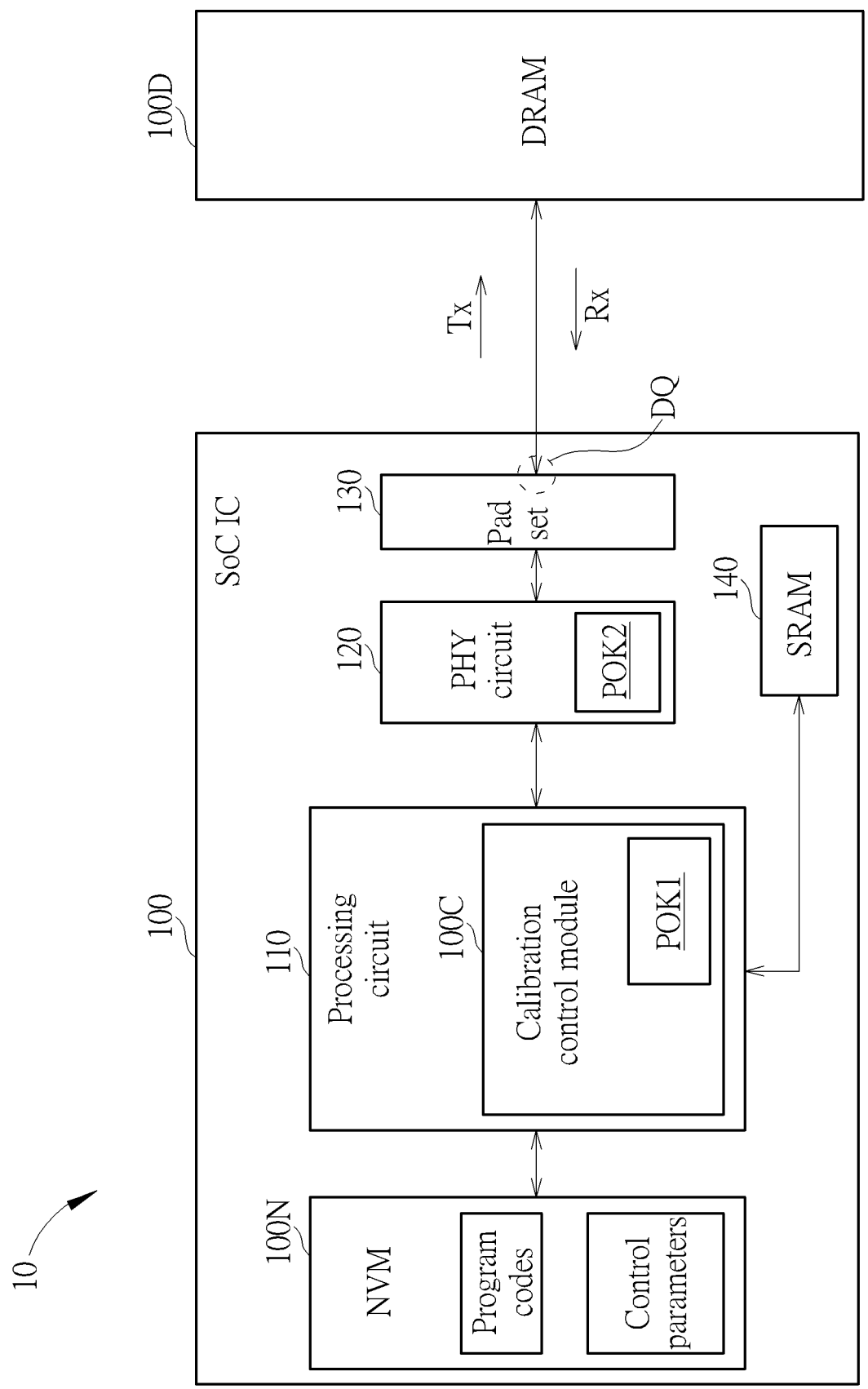
FIG. 1 is a diagram of a system on chip (SoC) integrated circuit (IC) according to an embodiment of the present invention.

FIG. 1 is a diagram of a system on chip (SoC) integrated circuit (IC) 100 according to an embodiment of the present invention, where the SoC IC 100 may be placed in an electronic device 10, and more particularly, may be mounted on a main board (e.g., a printed circuit board (PCB)) of the electronic device 10, but the present invention is not limited thereto. As shown in FIG. 1, in addition to the SoC IC 100, the electronic device 10 may comprise a dynamic random access memory (DRAM) 100D, for example, the DRAM 100D may also be mounted on the main board. In addition, the SoC IC 100 may comprise a non-volatile memory (NVM) 100N, a processing circuit 110, a physical layer (PHY) circuit 120, a pad set 130 and a static random access memory (SRAM) 140, where the processing circuit 110 may comprise at least one processor (e.g., one or more processors), and the pad set 130 may comprise a plurality of pads as terminals of the SoC IC 100 for coupling the SoC IC 100 to at least one external component (e.g., the DRAM 100D).

In the architecture shown in FIG. 1, the NVM 100N can be depicted in the SoC IC 100, but the prevent invention is not limited thereto. For example, the NVM 100N can be implemented outside the SoC IC 100. In addition, the NVM 100N can be implemented by way of electrically erasable programmable read-only memory (EEPROM), flash memory, etc., but the present invention is not limited thereto.

No matter whether the NVM 100N is implemented inside or outside the SoC IC 100, the NVM 100N may store information for the SoC IC 100, and may prevent the information from being lost during power off, where the information may comprise program codes, control parameters, etc. The processing circuit 110 can load the program codes from the NVM 100N to the aforementioned at least one processor, and the program codes running on the aforementioned at least one processor can control the operations of the electronic device 10. For example, a first program code of the above-mentioned program codes can be executed on the above-mentioned at least one processor to control the electronic device 10 to provide services to an user of the electronic device 10, but the present invention is not limited thereto. In some embodiments, a second program code of the above-mentioned program codes can be executed on the above-mentioned at least one processor to control the SoC IC 100 to perform memory calibration for the DRAM 100D. In addition, the SRAM 140 and the DRAM 100D can be regarded as the internal memory and the external memory of the SoC IC 100, respectively, and more particularly, can temporarily store information for the processing circuit 110 (e.g., the above-mentioned at least one processor), respectively. For example, the PHY circuit 120 can communicate with the DRAM 100D through the pad set 130 for the processing circuit 110 (e.g., the above-mentioned at least one processor), to allow the processing circuit 110 (e.g., the above-mentioned at least one processor) to access (e.g., write or read) data in the DRAM 100D.

When the electronic device 10 is powered up, the SoC IC 100 (such as the processing circuit 110, and more particularly, a calibration control module 100C therein) can use the PHY circuit 120 to perform preparation operations corresponding to multiple preparation phases on the DRAM 100D to make the DRAM 100D enter an idle state, and more particularly, to make the DRAM 100D enter a state of ready-for-use. For example, the multiple preparation phases may comprise: a power-up and initialization phase PHASE_1, where in this phase the processing circuit 110 (e.g., the calibration control module 100C therein) can control the PHY circuit 120 to apply power to the DRAM 100D through the pad set 130 and perform a series of operations related to initialization on the DRAM 100D; a ZQ calibration phase PHASE_2, where in this phase the processing circuit 110 (e.g., the calibration control module 100C therein) can control the PHY circuit 120 to trigger the DRAM 100D through the pad set 130 to perform resistance/impedance calibration regarding a set of data pins {DQ}, for example, the DRAM 100D can perform the resistance/impedance calibration with aid of a precision resistor having a predetermined resistance value that is connected to a pin ZQ thereof; and at least one subsequent phase such as one or more subsequent phases. Regarding some implementation details of the first two phases of the multiple preparation phases, please refer to existing DRAM-related standards such as the DDR3 SDRAM standard (e.g., JESD79-3), the DDR4 SDRAM standard (e.g., JESD79-4), etc.

After the preparation operations corresponding to the first two phases are completed, the DRAM 100D may enter the idle state, but it may not be in the state of ready-for-use. In order to correctly access the DRAM 100D, the processing circuit 110 (e.g., the calibration control module 100C therein) can perform preparation operations corresponding to the above-mentioned at least one subsequent phase, and these preparation operations may comprise at least one portion (e.g., a part or all) of the following operations:

(1) the processing circuit 110 (e.g., the calibration control module 100C therein) can try to configure the PHY circuit 120 and/or the DRAM 100D according to a plurality of control parameters read from the NVM 100N, and more particularly, perform calibration regarding reading (which can be regarded as read training) such as a reading-related calibration operation and calibration regarding writing (which can be regarded as write training) such as a writing-related calibration operation on the PHY circuit 120, and utilize at least one test control unit of the test control units POK1 and POK2 (e.g., one or all of the test control units POK1 and POK2) to perform a data access test to determine whether the configuration is completed;

(2) in a case that the above-mentioned data access test is unsuccessful, the processing circuit 110 (e.g., the calibration control module 100C therein) can calibrate at least one control parameter (e.g., one or more control parameters) used for controlling the PHY circuit 120 to access the DRAM 100D, such as at least one portion (e.g., a part or all) of the plurality of control parameters, and utilize the above-mentioned at least one test control unit to perform the data access test to determine whether the configuration is completed; wherein, the calibration operation can be performed multiple times until the above-mentioned data access test is successful, to ensure that the SoC IC 100 can correctly access (e.g., read or write) the DRAM 100D through the PHY circuit 120 after the configuration is completed, but the present invention not limited thereto.

For better comprehension, the data access test may comprise a read test and a write test, such as tests of reading and writing regarding predetermined data, and the correctness of a read result and the correctness of a write result can indicate the success of the read test and the write test respectively. As shown in FIG. 1, a receiving (Rx) direction and a transmitting (Transmitting, TX) direction of the SoC IC 100 relative to the DRAM 100D can indicate directions of reading and writing, respectively. For example, the processing circuit 110 (e.g., the calibration control module 100C therein) can perform calibration regarding reading, such as the calibration of phase and/or reference voltage, and more particularly, during performing the phase calibration, control the PHY circuit 120 to adjust a read delay amount stored in a read delay register within a receiver (e.g., a read capture circuit configured to capture data as the read result) therein to correspondingly adjust the number of enabled delay taps among multiple delay taps of the receiver in the PHY circuit 120, making the data capturing time point of the SoC side (e.g., the receiver in the PHY circuit 120) be aligned to a center of the data eye in the waveforms of a read signal (e.g., a data signal passing through a certain data pin DQ), wherein, the correctness of the read result can indicate that the read test is successful, and this can indicate that the calibration regarding reading is complete. For another example, the processing circuit 110 (e.g., the calibration control module 100C therein) can perform calibration regarding writing, such as phase and/or reference voltage calibration, and more particularly, during performing the phase calibration, control the PHY circuit 120 to adjust a write delay amount stored in a write delay register within a transmitter therein to correspondingly adjust the number of enabled delay taps among multiple delay taps of the transmitter in the PHY circuit 120, to adjust the phase of a write signal (e.g., a data signal passing through a certain data pin DQ) relative to a data strobe signal, making the data capturing time point of the DRAM side (e.g., a receiver in the DRAM 100D) be correct, which means that on the DRAM side, the center of the data eye in the waveforms of the write signal is aligned to the edge of the data strobe signal, where the write result being correct can indicate that the write test is successful, which can indicate that the calibration regarding writing is completed. As a result, the DRAM 100D can enter the state of ready-for-use.

According to some embodiments, the test control unit POK2 can perform the read test, and the test control unit POK1 can perform the write test, but the invention is not limited thereto. In some embodiments, the implementation of the test control unit POK1 and the test control unit POK2 may vary. For example, the test control unit POK1 can be integrated into the test control unit POK2. For another example, the test control unit POK2 can be integrated into the test control unit POK1.

According to some embodiments, the PHY circuit 120 (e.g., the test control unit POK2) can set a mode control register (not shown in FIG. 1) in the DRAM 100D, to make the DRAM 100D enter a test mode or a normal mode. In the test mode, the DRAM 100D can switch the internal access path thereof, to make the read or write data stream be redirected from the memory units in the DRAM 100D to a set of multi-purpose registers (MPR) (not shown in FIG. 1) of the DRAM 100D, where these memory units can be used for storing data for the SoC IC 100 in the normal mode. The PHY circuit 120 (e.g., the test control unit POK2) can write the predetermined data to the set of MPRs in advance for performing the read test. The PHY circuit 120 (e.g., the test control unit POK2) can trigger the DRAM 100D to continuously and/or repeatedly send the predetermined data back to the PHY circuit 120 in the SoC IC 100 during the read test. For example, the predetermined data may comprise a set of alternating bits (such as 01010101 or 10101010, rather than continuous bit 1 or continuous bit 0), and the data signal through a certain data pin DQ can carry a corresponding bit stream (such as {01010101, 01010101, . . . } or {10101010, 10101010, . . . }), allowing the data eye in the waveform of the data signal to be detected, but the present invention is not limited thereto. As the predetermined data is already known to the SoC IC 100 (e.g., the processing circuit 110, the calibration control module 100C and/or the PHY circuit 120), the PHY circuit 120 (e.g., the test control unit POK2) can read a read result from the DRAM 100D and compare the read result with the predetermined data to determine whether the read result is correct, to further determine whether the calibration regarding reading is complete. In addition, after the calibration regarding reading is completed, as all the read results are regarded as reliable, the processing circuit 110 (e.g., the calibration control module 100C therein) can perform the calibration regarding writing. For example, as any written data (e.g., data to be written) such as the predetermined data is already known to the SoC IC 100 (e.g., the processing circuit 110, the calibration control module 100C and/or the PHY circuit 120), the calibration control module 100C (e.g., the test control unit POK1) can control the PHY circuit 120 to write the any written data, to read a read result from the DRAM 100D, and compare the read result with the any written data such as the predetermined data to determine whether the read result is correct, to further determine whether the calibration regarding writing is completed.

Figure 2:
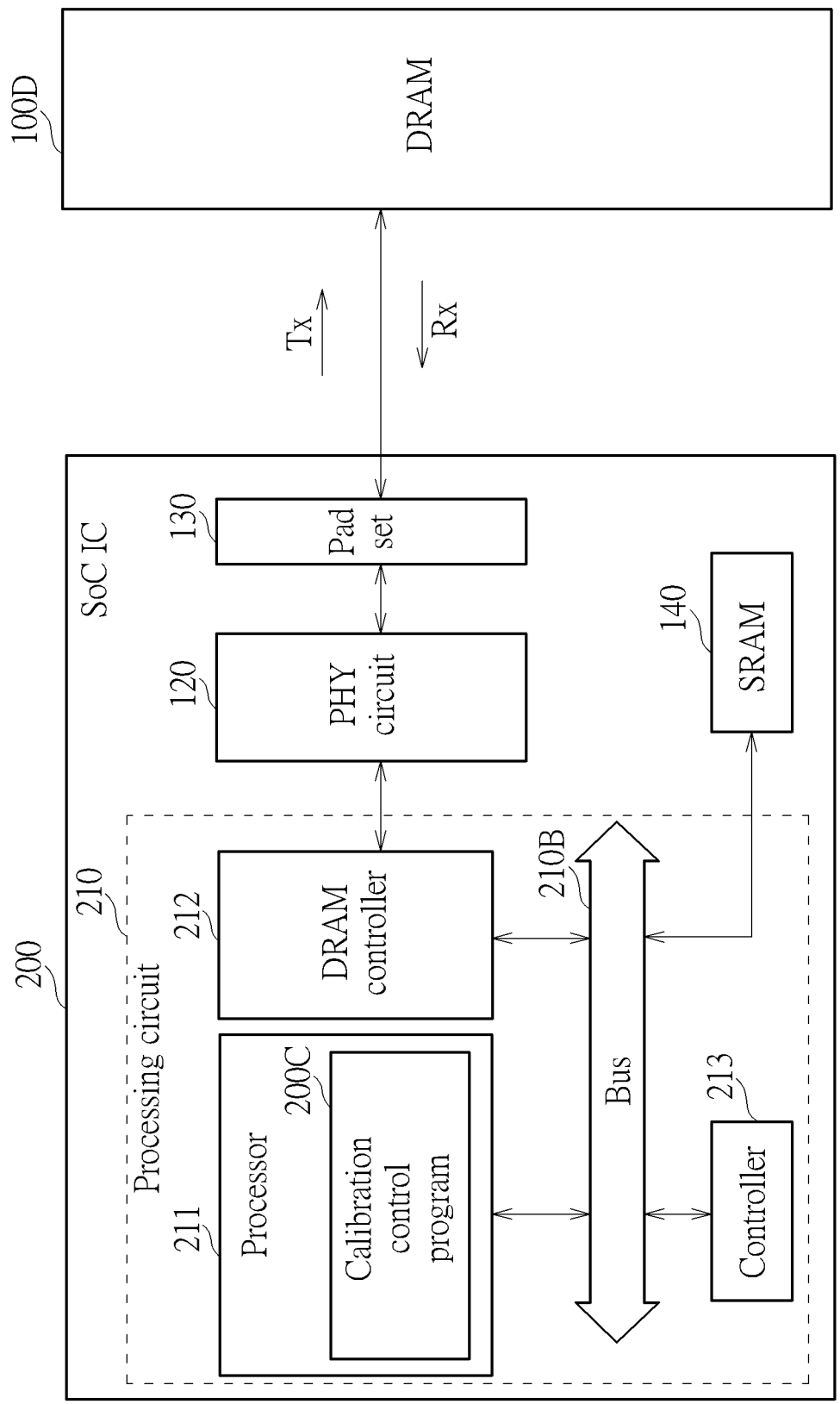
FIG. 2 is a diagram illustrating some implementation details of the SoC IC shown in FIG. 1 according to an embodiment of the present invention.

FIG. 2 is a diagram illustrating some implementation details of the SoC IC 100 shown in FIG. 1 according to an embodiment of the present invention. The architecture shown in FIG. 2 (such as a SoC IC 200 and a processing circuit 210, a calibration control program 200C, etc. therein) can be regarded as an example of the architecture shown in FIG. 1 (such as the SoC IC 100 and the processing circuit 110, the calibration control module 100C, etc. therein). The above-mentioned at least one processor may be collectively referred to as the processor 211 in this embodiment. In addition to the processor 211, the processing circuit 210 may further comprise a bus 210B and a DRAM controller 212, and further comprise at least one additional controller, which may be collectively referred to as a controller 213. The DRAM controller 212 can control the operations of the DRAM 100D through the PHY circuit 120, and the controller 213 can control some other operations. In this embodiment, the above-mentioned calibration control module 100C can be implemented by way of a calibration control program 200C running on the processor 211. For example, the second program code among the above-mentioned program codes can be loaded into the processor 211 to perform the calibration control program 200C running on the processor 211. For brevity, similar descriptions for this embodiment are not repeated in detail here.

Figure 3:
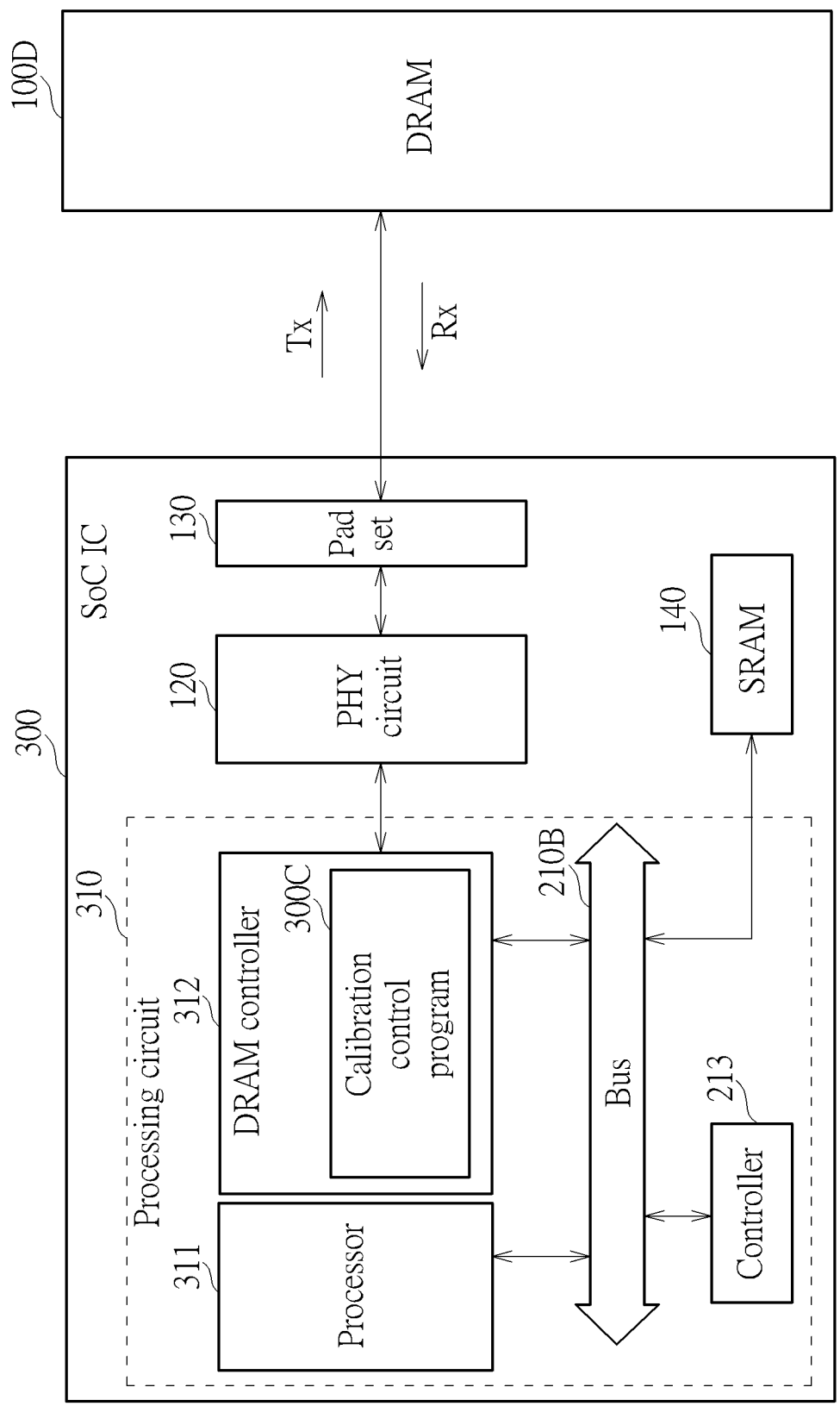
FIG. 3 is a diagram illustrating some implementation details of the SoC IC shown in FIG. 1 according to another embodiment of the present invention.

FIG. 3 is a diagram illustrating some implementation details of the SoC IC 100 shown in FIG. 1 according to another embodiment of the present invention. The architecture shown in FIG. 3 (such as a SoC IC 300 and a processing circuit 310, a calibration control circuit 300C, etc. therein) can be regarded as an example of the architecture shown in FIG. 1 (such as the SoC IC 100 and the processing circuit 110, the calibration control module 100C, etc. therein). The above-mentioned at least one processor may be collectively referred to as the processor 311 in this embodiment. In addition to the processor 311, the processing circuit 310 may further comprise the bus 210B, a DRAM controller 312 and the controller 213. The DRAM controller 312 can control the operations of the DRAM 100D through the PHY circuit 120. In this embodiment, the above-mentioned calibration control module 100C can be implemented by way of a hardware circuit, and more particularly, can be implemented as one of multiple sub-circuits of the DRAM controller 312, such as the calibration control circuit 300C. For brevity, similar descriptions for this embodiment are not repeated in detail here.

In some subsequent embodiments, the above-mentioned data eyes can be illustrated as hexagons for better comprehension, where the hexagons illustrated as a multilayer stack may represent the data eyes of a set of data signals passing through the set of data pins {DQ}, respectively, where the PHY circuit 120 may comprise sub-circuits of multiple slices (comprising respective receivers and transmitters thereof) corresponding to the set of data pins {DQ}, respectively, and the processing circuit 110 may selectively calibrate one or more slices when needed, but the present invention is not limited thereto. For example, the shape of the data eye in a typical eye diagram may be visualized as a hexagon or any of some other shapes. In addition, the set of data signals can carry a set of bits in any byte of one or more bytes. For example, the one or more bytes may represent the bytes read from the DRAM 100D. For another example, the one or more bytes may represent the bytes written to the DRAM 100D. Additionally, regarding the above-mentioned reference voltage calibration, the processing circuit 110 (e.g., the calibration control module 100C therein) can calibrate a reference voltage Vref used for determining whether a data bit is the bit 0 or the bit 1. For example, the reference voltage Vref may represent the reference voltage of the data signal of a certain data pin DQ (e.g., any data pin of the set of data pins {DQ}, and more particularly, each data pin of the set of data pins {DQ}), and therefore can be written as the reference voltage VrefDQ for better comprehension.

Figure 4:
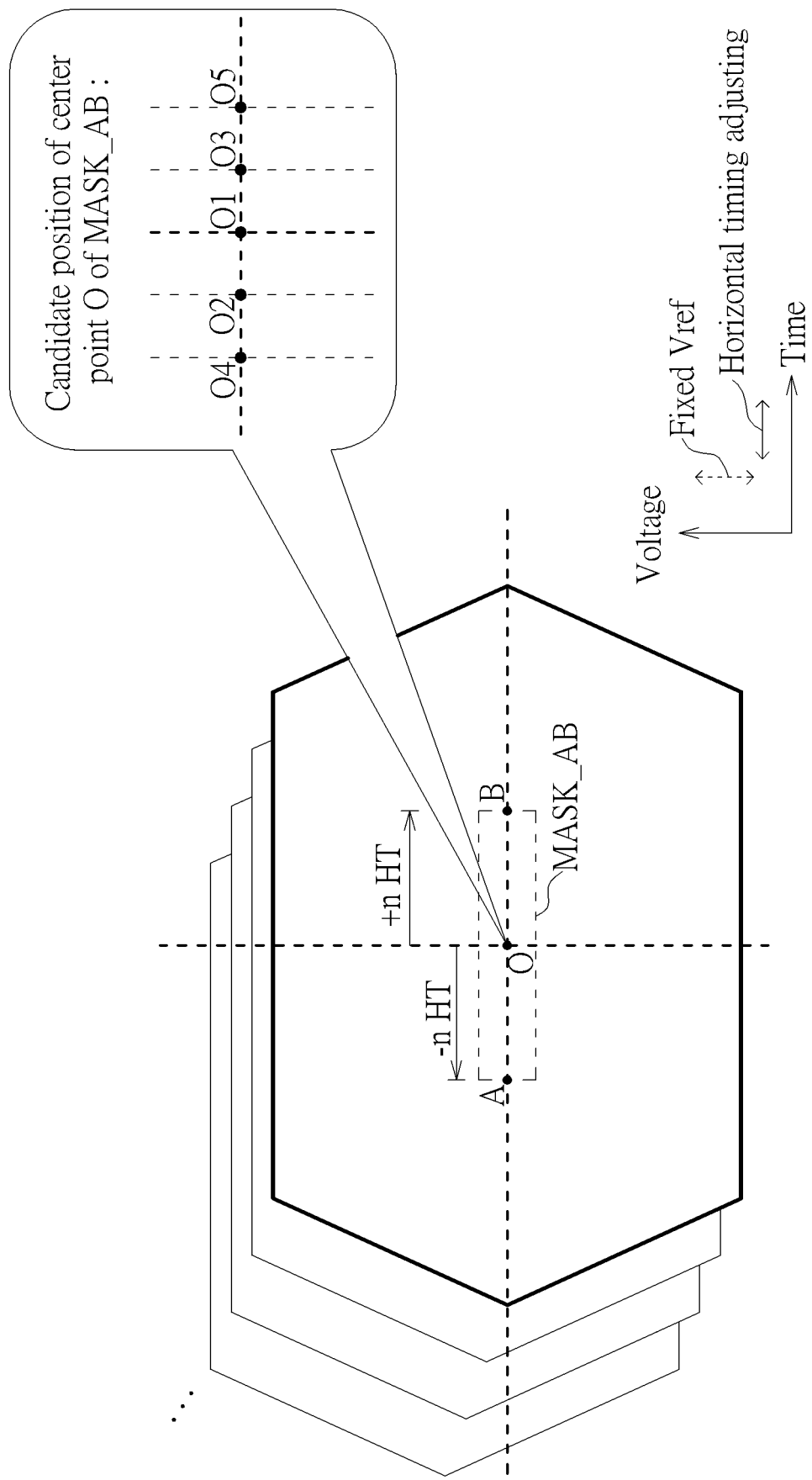
FIG. 4 is a diagram illustrating a horizontal timing calibration control scheme regarding writing of a method for performing memory calibration according to an embodiment of the present invention.

FIG. 4 is a diagram illustrating a horizontal timing calibration control scheme regarding writing of a method for performing memory calibration according to an embodiment of the present invention. When the DRAM 100D is a DDR3 SDRAM, the reference voltage Vref (e.g., the reference voltage VrefDQ) regarding writing may be equal to 750 millivolt (mV for short). When the DRAM 100D is a DDR3 SDRAM, the reference voltage Vref (e.g., the reference voltage VrefDQ) regarding writing may be equal to 750 millivolts (mV). As the reference voltage Vref is fixed, the calibration regarding writing may comprise horizontal timing calibration, and can be performed in a per-slice calibration manner, and the above-mentioned at least one control parameter may comprise a horizontal timing control parameter O_X, but the present invention is not limited thereto. For example, the calibration regarding writing can be performed in an all-slice calibration manner.

Under the control of the calibration control module 100C, the processing circuit 110 can perform the calibration regarding writing according to the horizontal timing calibration control scheme, and more particularly, can perform operations of the following Steps S31A-S37A:

(Step S31A) the processing circuit 110 can read a default value O_X0 of the horizontal timing control parameter O_X from the NVM 100N, for being written into the write delay register to be the write delay amount, wherein, regarding the horizontal coordinates, the default value O_X0 can correspond to the center point O (e.g., a candidate position O1 among the multiple candidate positions O1, O2, O3, O4, O5, etc. thereof) of a predetermined mask MASK_AB to indicate the data capturing time point on the DRAM side (e.g., the receiver in the DRAM 100D), and the predetermined mask MASK_AB can be defined by the mask coefficient n and the horizontal timing interval HT (e.g., the delay amount of each delay tap of the multiple delay taps of the transmitter);

(Step S32A) the processing circuit 110 can determine a set of test values corresponding to the predetermined mask MASK_AB according to the default value O_X0 of the horizontal timing control parameter O_X, where the set of test values may comprise two test values represented by a test point A and a test point B on the predetermined mask MASK_AB, for example, the respective horizontal coordinates of these test points, such as the horizontal coordinates obtained by adjusting the horizontal timing (e.g., by fixed or unfixed multiples) to the left or right relative to the central point O corresponding to the default value O_X0;

(Step S33A) the processing circuit 110 can respectively write these two test values (such as the above horizontal coordinates) in Step S32A into the write delay register to be the write delay amount to check whether the write test is passed, to determine whether to stop performing the calibration regarding writing, wherein, if the write test can be passed for the two cases that these two test values (such as the above horizontal coordinates) are used as the write delay amount, respectively, the processing circuit 110 can stop performing the calibration regarding writing, otherwise, the processing circuit 110 can continue subsequent operations to continue performing the calibration regarding writing at the next candidate position;

(Step S34A) the processing circuit 110 may adjust the default value O_X0 of the horizontal timing control parameter O_X according to a predetermined adjustment sequence such as the sequence of the multiple candidate positions O1, O2, O3, O4, O5, etc. to generate a candidate value O_Xc of the horizontal timing control parameter O_X, for being written into the write delay register to be the write delay amount, wherein, regarding the horizontal coordinates, the candidate value O_Xc may correspond to a subsequent candidate position of the multiple candidate positions O1, O2, O3, O4, O5, etc., such as one of the candidate positions O2, O3, O4, O5, etc., to indicate the data capturing time point on the DRAM side (e.g., the receiver in the DRAM 100D);

(Step S35A) the processing circuit 110 may determine a set of test values corresponding to the predetermined mask MASK_AB according to the candidate value O_Xc of the horizontal timing control parameter O_X, where the set of test values may comprise two test values represented by the test points A and B on the predeterminedmaskMASK_AB, for example, the respective horizontal coordinates of these test points, such as the horizontal coordinates obtained by adjusting the horizontal timing (e.g., by fixed or unfixed multiples) to the left or right relative to the point corresponding to the candidate value O_Xc (similar to the way of Step S32A) with fixed multiple horizontal timing adjustment (e.g., n times the horizontal timing interval HT);

(Step S36A) the processing circuit 110 can respectively write these two test values (such as the above horizontal coordinates) in Step S35A into the write delay register to be the write delay amount to check whether the write test is passed, to determine whether to stop performing the calibration regarding writing, wherein, if the write test can be passed for the two cases that these two test values (such as the above horizontal coordinates) are used as the write delay amount, respectively, the processing circuit 110 can stop performing the calibration regarding writing, otherwise, the processing circuit 110 can perform similar operations to continue performing the calibration regarding writing at the next candidate position, until all candidate positions among the multiple candidate positions O1, O2, O3, O4, O5, etc. are used up;

(Step S37A) when it is determined to stop performing the calibration regarding writing, the processing circuit 110 can update the horizontal timing control parameter O_X in the NVM 100N to be the latest candidate value O_Xc, such as the last candidate value O_Xc obtained and used in the loop of Steps S34A-S36A above; where the success of the write test on the test points A and B can indicate that the write test on all possible or available test points in the region enclosed by the predetermined mask MASK_AB is expected to be successful, but the present invention Not limited thereto. For example, if the failure of the write test continues to occur until all candidate positions among the multiple candidate positions O1, O2, O3, O4, O5, etc. are used up, the processing circuit 110 may issue an error message, rather than executing Step S37A. In addition, in the above operations, the processing circuit 110 can selectively move the predetermined mask MASK_AB (together with the test points A and B thereon) in multiple rounds to perform the write test corresponding to the predetermined mask MASK_AB according to the multiple candidate positions O1, O2, O3, O4, O5, etc., respectively. For brevity, similar descriptions for this embodiment are not repeated in detail here.

According to some embodiments, the multiple candidate positions O1, O2, O3, O4, O5, etc. of the predetermined mask MASK_AB may vary. For example, the number and/or arrangement of candidate positions of the predetermined mask MASK_AB may vary.

Figure 5:
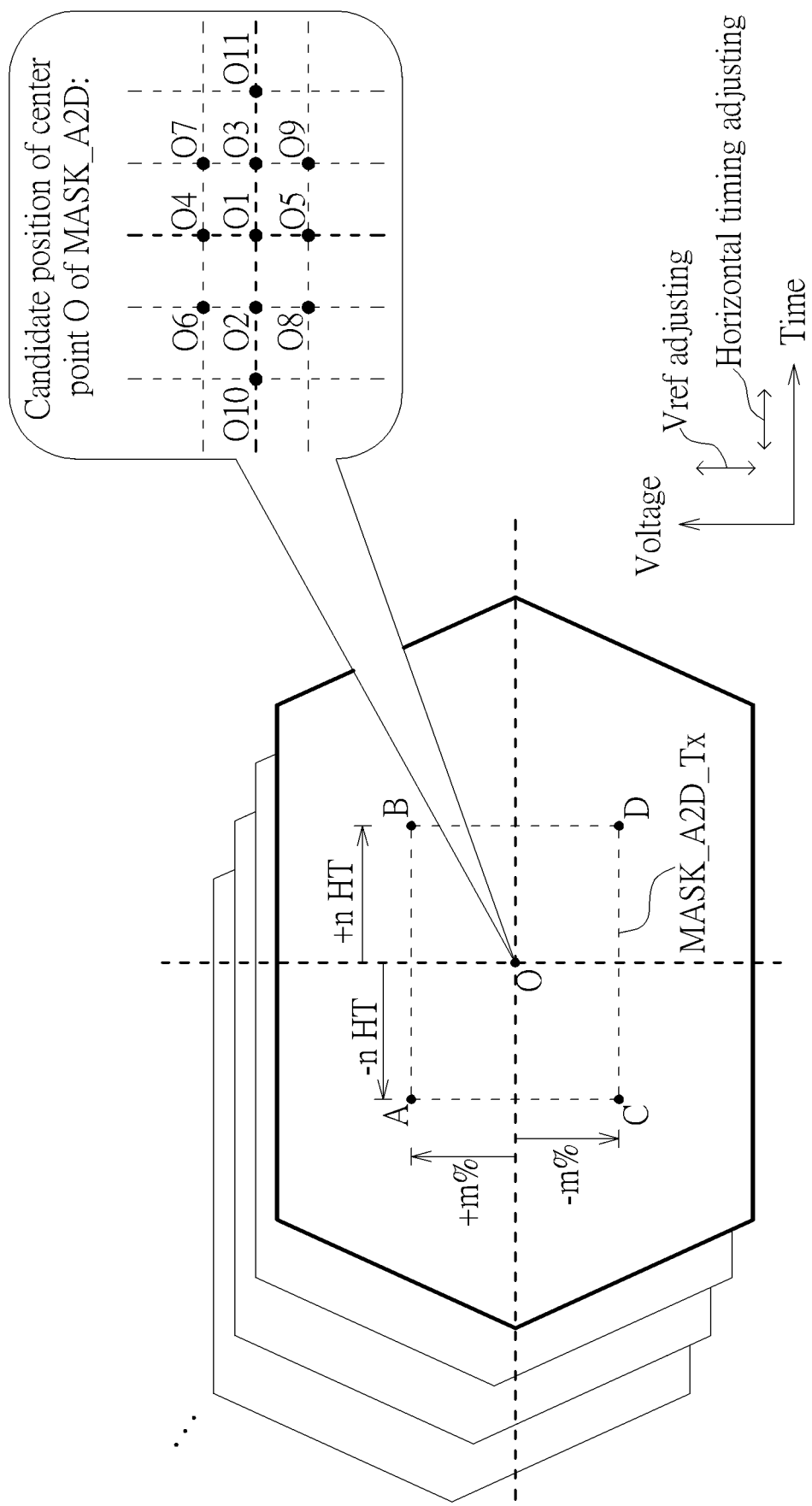
FIG. 5 is a diagram illustrating a horizontal timing and reference voltage calibration control scheme regarding writing of the method according to an embodiment of the present invention.

FIG. 5 is a diagram illustrating a horizontal timing and reference voltage calibration control scheme regarding writing of the method according to an embodiment of the present invention. In comparison with the horizontal timing calibration control scheme that can provide one-dimensional calibration as shown in FIG. 4, this horizontal timing and reference voltage calibration control scheme can provide two-dimensional calibration. For example, when the DRAM 100D is a DDR4 SDRAM, the reference voltage Vref (e.g., the reference voltage VrefDQ) regarding writing is adjustable. The calibration regarding writing may comprise the horizontal timing calibration and the reference voltage calibration, and can be performed in the all-slice calibration manner, and the above-mentioned at least one control parameter may comprise the horizontal timing control parameter O_X and a reference voltage parameter O_Y, where the reference voltage parameter O_Y can indicate a predetermined voltage level of the reference voltage Vref for writing, but the invention is not limited thereto. In some embodiments, the reference voltage parameter O_Y can be illustrated as the reference voltage Vref for better comprehension.

Under the control of the calibration control module 100C, the processing circuit 110 can perform the calibration regarding writing according to the horizontal timing and reference voltage calibration control scheme, and more particularly, can perform operations of the following Steps S31B-S37B (Step S31B) in addition to reading the default value O_X0 of the horizontal timing control parameter O_X from the NVM 100N for being written into the write delay register to be the write delay amount, the processing circuit 110 can read a default value O_Y0 of the reference voltage parameter O_Y from the NVM 100N for being written into a reference voltage control register to be the predetermined voltage level of the reference voltage Vref, wherein, regarding the horizontal and vertical coordinates, the default value (O_X0, O_Y0) can correspond to the center point O of a predetermined mask MASK_A2D_Tx (e.g., the candidate position O1 among multiple candidate positions O1, O2, O3, O4, O5, O6, O7, O8, O9, O10, O11, etc. thereof) to indicate the data capturing time point and the predetermined voltage level of the reference voltage Vref on the DRAM side (e.g., the receiver in the DRAM 100D), and the predetermined mask MASK_A2D_Tx can be defined by the mask coefficients m and n and the horizontal timing interval HT;

(Step S32B) the processing circuit 110 can determine a set of test values corresponding to the predetermined mask MASK_A2D_Tx according to the default values (O_X0, O_Y0), where the set of test values may comprise a series of test values represented by the test points A, B, C, and D on the predetermined mask MASK_A2D_Tx, for example, the respective horizontal and vertical coordinates of these test points, such as the horizontal coordinates obtained (with similar method of FIG. 4) by performing horizontal adjustment (e.g., the adjustment being performed with n times the horizontal timing interval HT) relative to the central point O corresponding to the default value O_X0, and the vertical coordinates obtained by performing vertical adjustments with a fixed proportion (e.g., m %) or non-fixed proportion upward and downward relative to the central point O corresponding to the default value O_Y0, respectively;

(Step S33B) the processing circuit 110 can respectively write this series of test values (e.g., the above coordinates, such as the sets of horizontal and vertical coordinates of these test points) in Step S32B to the write delay register (to be the write delay amount) and the reference voltage control register (to be the predetermined voltage level) to check whether the write test is passed, to determine whether to stop performing the calibration regarding writing, wherein, if the write test can be passed for the four cases that this series of test values (such as the above coordinates) are used as the write delay amount and the predetermined voltage level, respectively, the processing circuit 110 can stop performing the calibration regarding writing, otherwise, the processing circuit 110 can continue subsequent operations to continue performing the calibration regarding writing at the next candidate position;

(Step S34B) the processing circuit 110 may adjust the respective default values O_X0 and O_Y0 of the horizontal timing control parameter O_X and the reference voltage parameter O_Y according to a predetermined adjustment sequence such as a sequence of the multiple candidate positions O1, O2, O3, O4, O5, O6, O7, O8, O9, O10, O11, etc. to generate the respective candidate values O_Xc and O_Yc of the horizontal timing control parameter O_X and the reference voltage parameter O_Y for being written into the write delay register (to be the write delay amount) and the reference voltage control register (to be the predetermined voltage level), where regarding the horizontal and vertical coordinates, the candidate values (O_Xc, O_Yc) can correspond to a subsequent candidate position of the multiple candidate positions O1, O2, O3, O4, O5, O6, O7, O8, O9, O10, O11, etc., such as one of the candidate positions O2, O3, O4, O5, O6, O7, O8, O9, O10, O11, etc., to indicate the data capturing time point and the predetermined voltage level of the reference voltage Vref on the DRAM side (e.g., the receiver in the DRAM 100D);

(Step S35B) the processing circuit 110 may determine a set of test values corresponding to the predetermined mask MASK_A2D_Tx according to the candidate values (O_Xc, O_Yc), where the set of test values may comprise a series of test values represented by the test points A, B, C and D on the predetermined mask MASK_A2D_Tx, for example, the respective horizontal and vertical coordinates of these test points, and the method of obtaining the coordinates of this series of test values is similar to that of Step S32B (and the default values (O_X0, O_Y0) are replaced with the candidate values (O_Xc, O_Yc)), so similar descriptions are not repeated in detail here;

(Step S36B) the processing circuit 110 can respectively write this series of test values (e.g., the above coordinates, such as the sets of horizontal and vertical coordinates of these test points) in Step S35B to the write delay register (to be the write delay amount) and the reference voltage control register (to be the predetermined voltage level) to check whether the write test is passed, to determine whether to stop performing the calibration regarding writing, wherein, if the write test can be passed for the four cases that this series of test values (e.g., the above coordinates) are used as the write delay amount and the predetermined voltage level, respectively, the processing circuit 110 can stop performing the calibration regarding writing, otherwise, the processing circuit 110 can perform similar operations to continue performing the calibration regarding writing at the next candidate position until all the candidate positions among the multiple candidate positions O1, O2, O3, O4, O5, O6, O7, O8, O9, O10, O11, etc. are used up;

(Step S37B) when it is determined to stop performing the calibration regarding writing, the processing circuit 110 may update the horizontal timing control parameter O_X and the reference voltage parameter O_Y in the NVM 100N to be their respective latest candidate values (O_Xc, O_Yc), such as the last candidate values (O_Xc, O_Yc) obtained and used in the loop of Steps S34B-S36B above;

where the success of the write test on the test points A, B, C, and D can indicate that the write test on all possible or available test points in the region enclosed by the predetermined mask MASK_A2D_Tx is expected to be successful, but the present invention is not limited thereto. For example, if the failure of the write test continues to occur until all candidate positions among the multiple candidate positions O1, O2, O3, O4, O5, O6, O7, O8, O9, O10, O11, etc. are used up, the processing circuit 110 may issue an error message, rather than executing Step S37B. In addition, in the above operations, the processing circuit 110 can selectively move the predetermined mask MASK_A2D_Tx (together with the test points A, B, C, and D thereon) in multiple rounds to perform the write test corresponding to the predetermined mask MASK_A2D_Tx according to the multiple candidate positions O1, O2, O3, O4, O5, O6, O7, O8, O9, O10, O11, etc., respectively. For brevity, similar descriptions for this embodiment are not repeated in detail here.

According to some embodiments, the multiple candidate positions O1, O2, O3, O4, O5, O6, O7, O8, O9, O10, O11, etc. of the predetermined mask MASK_A2D_Tx may vary. For example, the number and/or arrangement of candidate positions of the predetermined mask MASK_A2D_Tx may vary.

Figure 6:
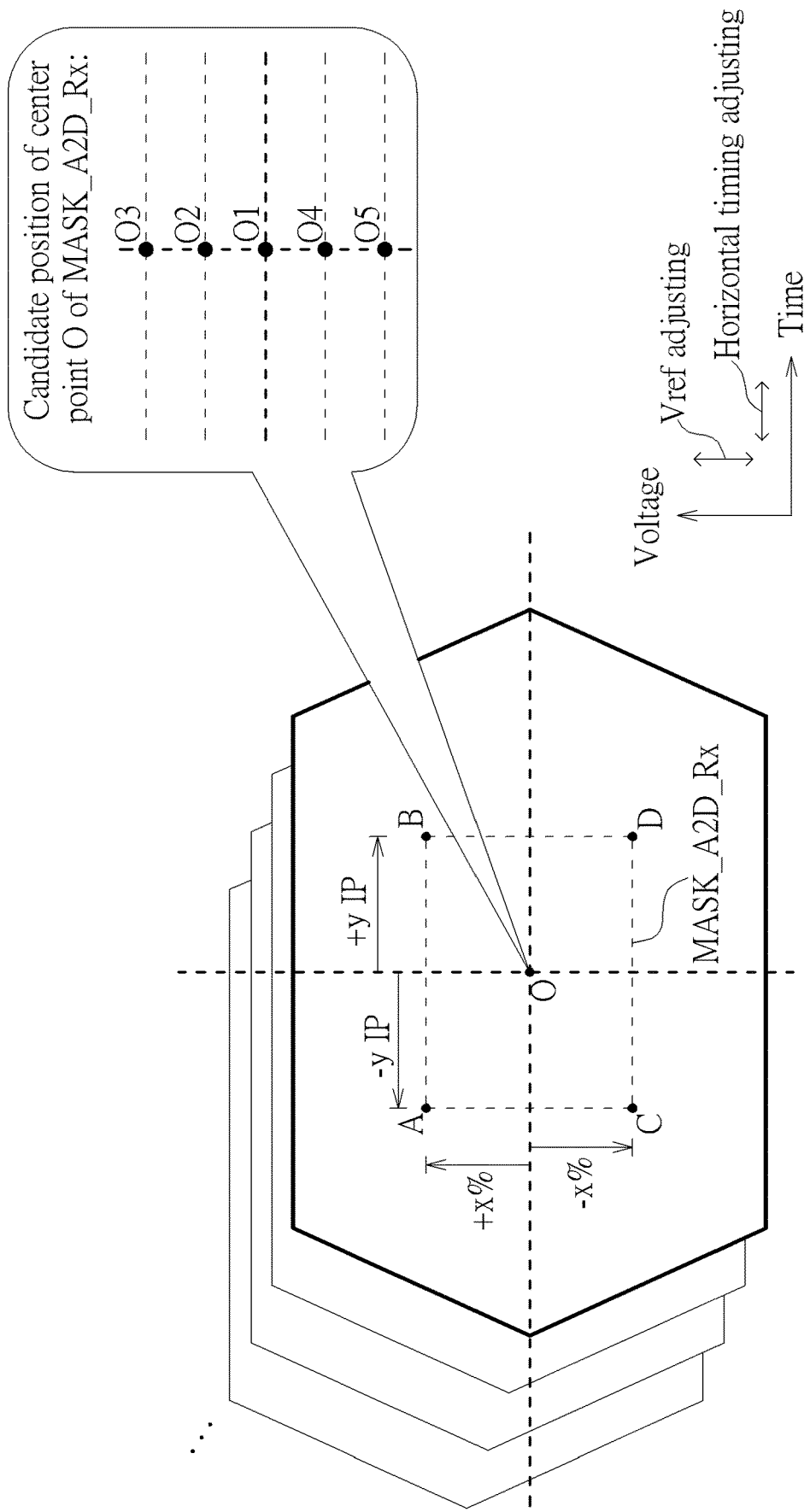
FIG. 6 is a diagram illustrating a horizontal timing and reference voltage calibration control scheme regarding reading of the method according to an embodiment of the present invention.

FIG. 6 is a diagram illustrating a horizontal timing and reference voltage calibration control scheme regarding reading of the method according to an embodiment of the present invention. In comparison with the embodiment shown in FIG. 5, the horizontal timing and reference voltage calibration control scheme of this embodiment uses the predetermined mask MASK_A2D_Rx corresponding to reading instead of the predetermined mask MASK_A2D_Tx corresponding to writing, and can also provide two-dimensional calibration. For example, no matter whether the DRAM 100D belongs to DDR3 SDRAM, DDR4 SDRAM, etc., the reference voltage Vref (e.g., the reference voltage VrefDQ) regarding reading is adjustable. The calibration regarding reading may comprise horizontal timing calibration and reference voltage calibration, and can be performed in the all-slice calibration manner, and the above-mentioned at least one control parameter may comprise another horizontal timing control parameter O_X and another reference voltage parameter O_Y, but the present invention is not limited thereto. For example, related symbols such as Vref (e.g., VrefDQ), O, A, B, C, D, O_X, O_Y, O_X0, O_Y0, O_Xc, O_Yc, etc. can be added "(1)" as suffix thereof in any of the embodiments respectively shown in FIG. 4 and FIG. 5 to be rewritten as Vref (1) (e.g., VrefDQ (1)), O(1), A(1), B(1), C(1), D(1), O_X(1), O_Y(1), O_X0(1), O_Y0(1), O_Xc(1), O_Yc(1), etc., or can be added "(0)" as suffix thereof in this embodiment to be rewritten as Vref(0) (e.g., VrefDQ(0)), O(0), A(0), B(0), C(0), D(0), O_X(0), O_Y(0), O_X0(0), O_Y0(0), O_Xc(0), O_Yc(0), etc., where the symbols without the suffix "(0)" are used below to illustrate for brevity.

Under the control of the calibration control module 100C, the processing circuit 110 can perform the calibration regarding reading according to the horizontal timing and reference voltage calibration control scheme of this embodiment, and more particularly, can perform operations of the following Steps S31C-S37C:

(Step S31C) in addition to reading the default value O_X0 of the horizontal timing control parameter O_X from the NVM 100N for being written into the read delay register to be the read delay amount, the processing circuit 110 can read the default value O_Y0 of the reference voltage parameter O_Y from the NVM 100N for being written into another reference voltage control register to be a predetermined voltage level of the reference voltage Vref, where regarding the horizontal and vertical coordinates, the default values (O_X0, O_Y0) can correspond to the center point O (e.g., the candidate position O1 among the multiple candidate positions O1, O2, O3, O4, O5, etc. thereof) of the predetermined mask MASK_A2D_Rx to indicate the data capturing time point and the predetermined voltage level of the reference voltage Vref on the SoC side (e.g., the receiver in the PHY circuit 120), and the predetermined mask MASK_A2D_Rx can be defined by the mask coefficients x and y and the inter-tap period IP (e.g., the delay amount of each delay tap of the multiple delay taps of the receiver);

(Step S32C) the processing circuit 110 may determine a set of test values corresponding to the predetermined mask MASK_A2D_Rx according to the default values (O_X0, O_Y0), wherein, the set of test values may comprise a series of test values represented by the test points A, B, C and D on the predetermined mask MASK_A2D_Rx, for example, the respective horizontal and vertical coordinates of these test points, such as the horizontal coordinates obtained (with similar method of FIG. 5) by performing horizontal adjustment (e.g., the adjustment being performed with y times the inter-tap period IP) relative to the central point O corresponding to the default value O_X0, and the vertical coordinates obtained by performing vertical adjustments with a fixed proportion (e.g., x %) or non-fixed proportion upward and downward relative to the central point O corresponding to the default value O_Y0, respectively;

(Step S33C) the processing circuit 110 can respectively write this series of test values (e.g., the above coordinates, such as the sets of horizontal and vertical coordinates of these test points) in Step S32C to the read delay register (to be the read delay amount) and the other reference voltage control register (to be the predetermined voltage level) to check whether the read test is passed, to determine whether to stop performing the calibration regarding reading, wherein, if the read test can be passed for the four cases that this series of test values (such as the above coordinates) are used as the read delay amount and the predetermined voltage level, respectively, the processing circuit 110 can stop performing the calibration regarding reading, otherwise, the processing circuit 110 can continue subsequent operations to continue performing the calibration regarding reading at the next candidate position;

(Step S34C) the processing circuit 110 may adjust the respective default values O_X0 and O_Y0 of the horizontal timing control parameter O_X and the reference voltage parameter O_Y according to a predetermined adjustment sequence such as a sequence of the multiple candidate positions O1, O2, O3, O4, O5, etc. to generate the respective candidate values O_Xc and O_Yc of the horizontal timing control parameter O_X and the reference voltage parameter O_Y for being written into the read delay register (to be the read delay amount) and the other reference voltage control register (to be the predetermined voltage level), where regarding the horizontal and vertical coordinates, the candidate values (O_Xc, O_Yc) can correspond to a subsequent candidate position of the multiple candidate positions O1, O2, O3, O4, O5, etc., such as one of the candidate positions O2, O3, O4, O5, etc., to indicate the data capturing time point and the predetermined voltage level of the reference voltage Vref on the SoC side (e.g., the receiver in the PHY circuit 120);

(Step S35C) the processing circuit 110 may determine a set of test values corresponding to the predetermined mask MASK_A2D_Rx according to the candidate values (O_Xc, O_Yc), where the set of test values may comprise a series of test values represented by the test points A, B, C and D on the predetermined mask MASK_A2D_Rx, for example, the respective horizontal and vertical coordinates of these test points, and the method of obtaining the coordinates of this series of test values is similar to that of Step S32C (and the default values (O_X0, O_Y0) are replaced with the candidate values (O_Xc, O_Yc)), so similar descriptions are not repeated in detail here;

(Step S36C) the processing circuit 110 can respectively write this series of test values (e.g., the above coordinates, such as the sets of horizontal and vertical coordinates of these test points) in Step S35C to the read delay register (to be the read delay amount) and the other reference voltage control register (to be the predetermined voltage level) to check whether the read test is passed, to determine whether to stop performing the calibration regarding reading, wherein, if the read test can be passed for the four cases that this series of test values (e.g., the above coordinates) are used as the read delay amount and the predetermined voltage level, respectively, the processing circuit 110 can stop performing the calibration regarding reading, otherwise, the processing circuit 110 can perform similar operations to continue performing the calibration regarding reading at the next candidate position until all the candidate positions among the multiple candidate positions O1, O2, O3, O4, O5, etc. are used up;

(Step S37C) when it is determined to stop performing the calibration regarding reading, the processing circuit 110 may update the horizontal timing control parameter O_X and the reference voltage parameter O_Y in the NVM 100N to be their respective latest candidate values (O_Xc, O_Yc), such as the last candidate values (O_Xc, O_Yc) obtained and used in the loop of Steps S34C-S36C above;

where the success of the read test on the test points A, B, C, and D can indicate that the read test on all possible or available test points in the region enclosed by the predetermined mask MASK_A2D_Rx is expected to be successful, but the present invention is not limited thereto. For example, if the failure of the read test continues to occur until all candidate positions among the multiple candidate positions O1, O2, O3, O4, O5, etc. are used up, the processing circuit 110 may issue an error message, rather than executing Step S37C. In addition, in the above operations, the processing circuit 110 can selectively move the predetermined mask MASK_A2D_Rx (together with the test points A, B, C, and D thereon) in multiple rounds to perform the read test corresponding to the predetermined mask MASK_A2D_Rx according to the multiple candidate positions O1, O2, O3, O4, O5, etc., respectively. For brevity, similar descriptions for this embodiment are not repeated in detail here.

According to some embodiments, the multiple candidate positions O1, O2, O3, O4, O5, etc. of the predetermined mask MASK_A2D_Rx may vary. For example, the number and/or arrangement of candidate positions of the predetermined mask MASK_A2D_Rx may vary. More particularly, the candidate positions O1, O2, O3, O4, O5, etc. shown in FIG. 6 can be regarded as the candidate positions in one-dimensional arrangement, but the present invention is not limited thereto. When there is a need, the candidate positions in two-dimensional arrangement (e.g., the candidate positions O1, O2, O3, O4, O5, O6, O7, O8, O9, O10, O11, etc. shown in FIG. 5) can be used as the candidate positions of the predetermined mask MASK_A2D_Rx.

According to some embodiments, the read test involved with the predetermined mask MASK_A2D_Rx may vary. For example, the read test can be implemented by way of a horizontal timing margin test, etc.

Figure 7:
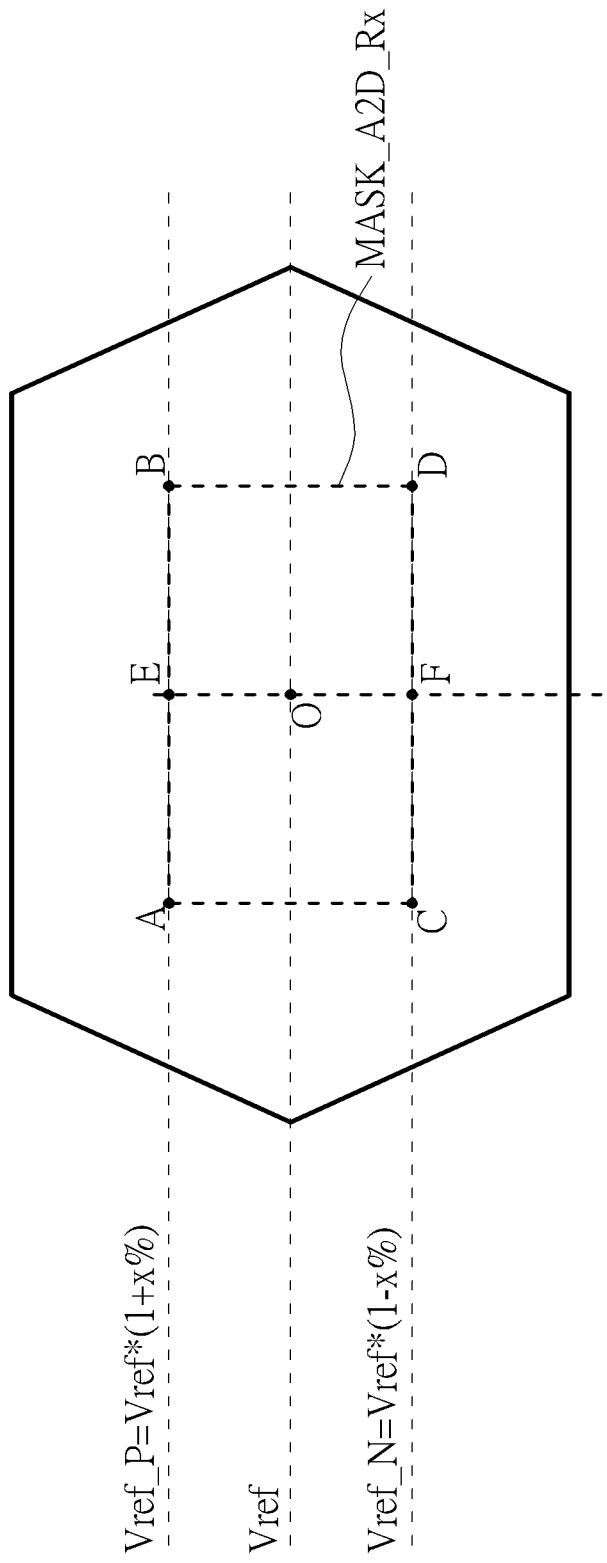
FIG. 7 illustrates an example of the reference voltage associated with a predetermined mask shown in FIG. 6.

FIG. 7 illustrates an example of the reference voltage associated with the predetermined mask MASK_A2D_Rx shown in FIG. 6. The reference voltage Vref_P passing through the test points A and B and the reference voltage Vref_N passing through the test points C and D can be expressed with the reference voltage Vref (e.g., the reference voltage Vref(0)) passing through the center point O as follows:

$$Vref\_P = Vref*(1+x\%); \text{ and}$$

$$Vref\_N = Vref*(1-x\%);$$

wherein, the reference points E and F on the predetermined mask MASK_A2D_Rx may represent the intersections of the predetermined mask MASK_A2D_Rx and a central vertical line (e.g., a vertical line passing through the center point O) thereof, and may be used in the above-mentioned horizontal timing margin test.

Figure 8:
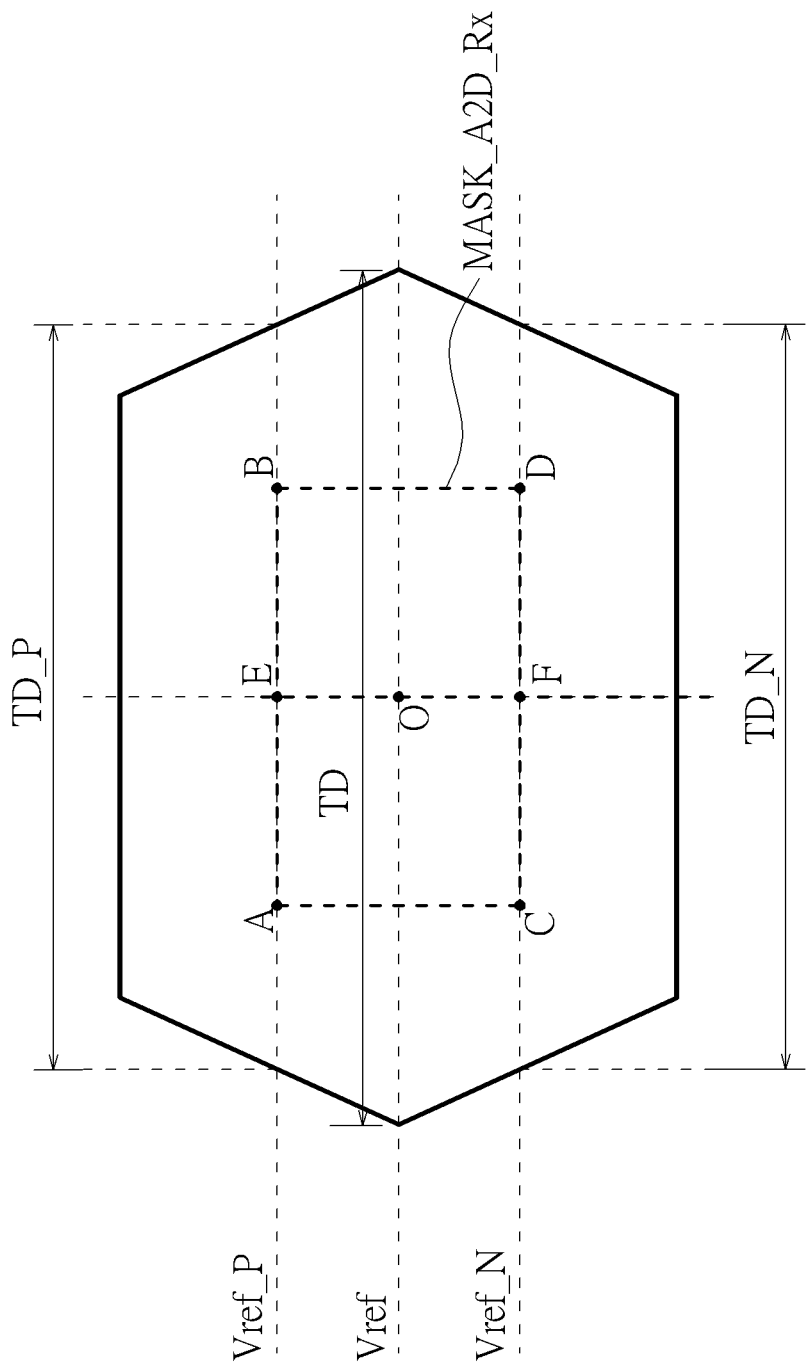
FIG. 8 is a diagram illustrating a horizontal timing and reference voltage calibration control scheme regarding reading of the method according to another embodiment of the present invention.

FIG. 8 is a diagram illustrating a horizontal timing and reference voltage calibration control scheme regarding reading of the method according to another embodiment of the present invention, where the read test can be implemented as the horizontal timing margin test. Regarding that the center point O of the predetermined mask MASK_A2D_Rx is equal to a certain candidate position (e.g., one of the multiple candidate positions O1, O2, O3, O4, O5, etc.), the processing circuit 110 can calculate the three time differences TD, TD_P, and TD_N represented by the three horizontal line segments obtained from cutting the central horizontal line (e.g., the horizontal line passing through the center point O), the upper horizontal line (e.g., the horizontal line passing through reference point E), and the lower horizontal line (e.g., the horizontal line passing through reference point F) of the predetermined mask MASK_A2D_Rx by the data eye, respectively, and determine whether the read test is successful according to whether the three time differences TD, TD_P and TD_N are all greater than the width $(2*(y*(IP)))$ of the predetermined mask MASK_A2D_Rx. If the three time differences TD, TD_P and TD_N are all greater than a predetermined horizontal timing margin such as the width $(2*(y*(IP)))$ of the predetermined mask MASK_A2D_Rx, which may indicate that the whole of the predetermined mask MASK_A2D_Rx is located in the data eye, the processing circuit 110 may determine that the read test is successful; otherwise (e.g., the boundary of the predetermined mask MASK_A2D_Rx exceeds the data eye), the processing circuit 110 may determine that the read test is unsuccessful. For brevity, similar descriptions for this embodiment are not repeated in detail here.

Figure 9:
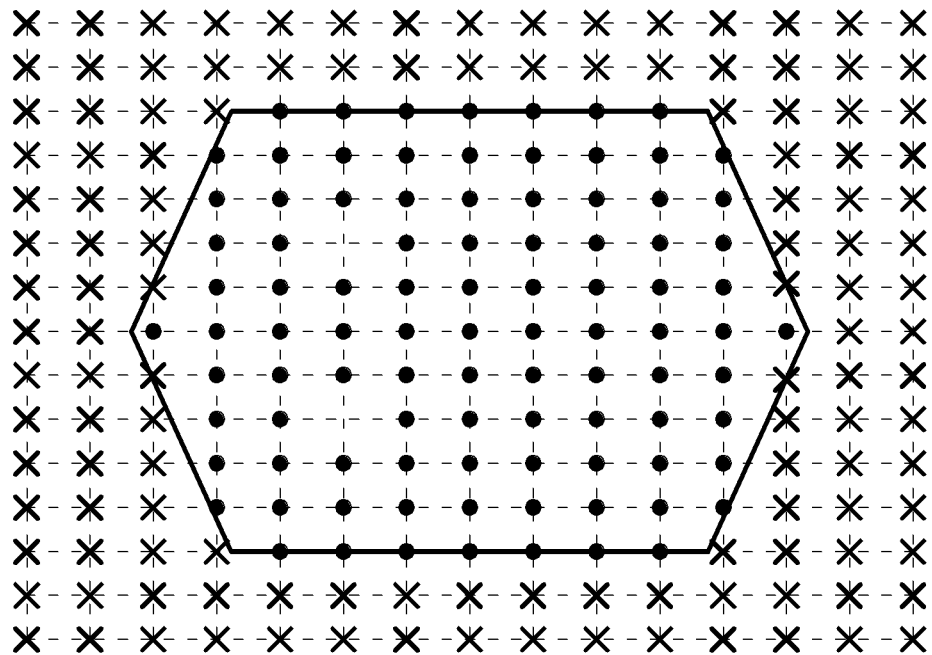
FIG. 9 illustrates, in the lower half thereof, a fast calibration control scheme of the method according to an embodiment of the present invention, wherein for better comprehension.
Figure 9:
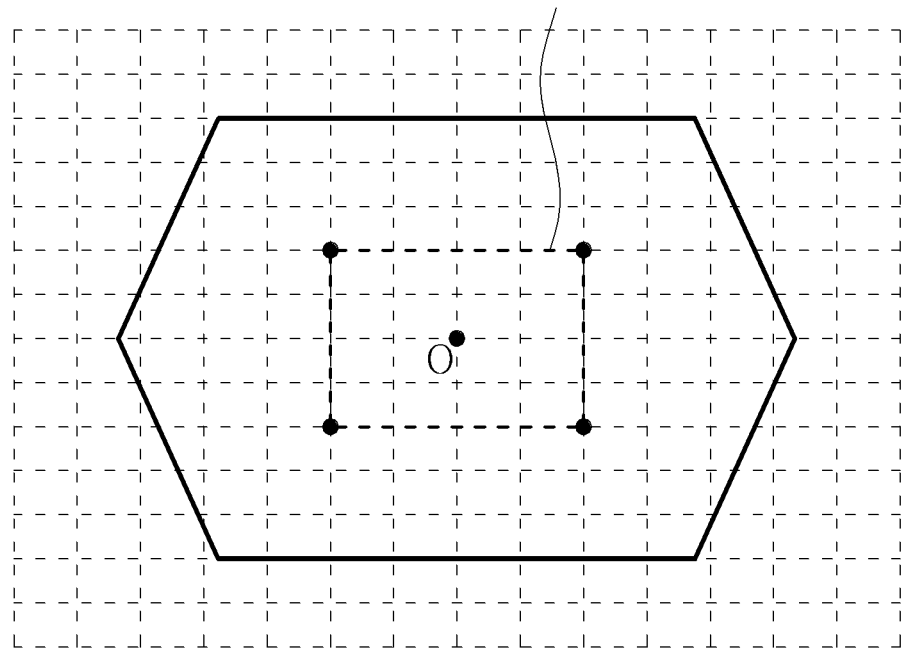

FIG. 9 illustrates, in the lower half thereof, a fast calibration control scheme of the method according to an embodiment of the present invention, wherein for better comprehension, FIG. 9 illustrates a scanning calibration control scheme (e.g., performing tests with respect to all possible parameter combinations) in the upper half thereof. The predetermined mask MASK may represent one of the above-mentioned predetermined masks MASK_A2D_Rx, MASK_A2D_Tx, MASK_AB, etc., and the fast calibration control scheme may represent the corresponding control scheme in the above embodiments. As the fast calibration control scheme does not need to perform tests with respect to all possible parameter combinations, the architecture of the present invention can efficiently perform the memory calibration to shorten the boot time of the electronic device 10 and bring a better user experience. For brevity, similar descriptions for this embodiment are not repeated in detail here.

Figure 10:
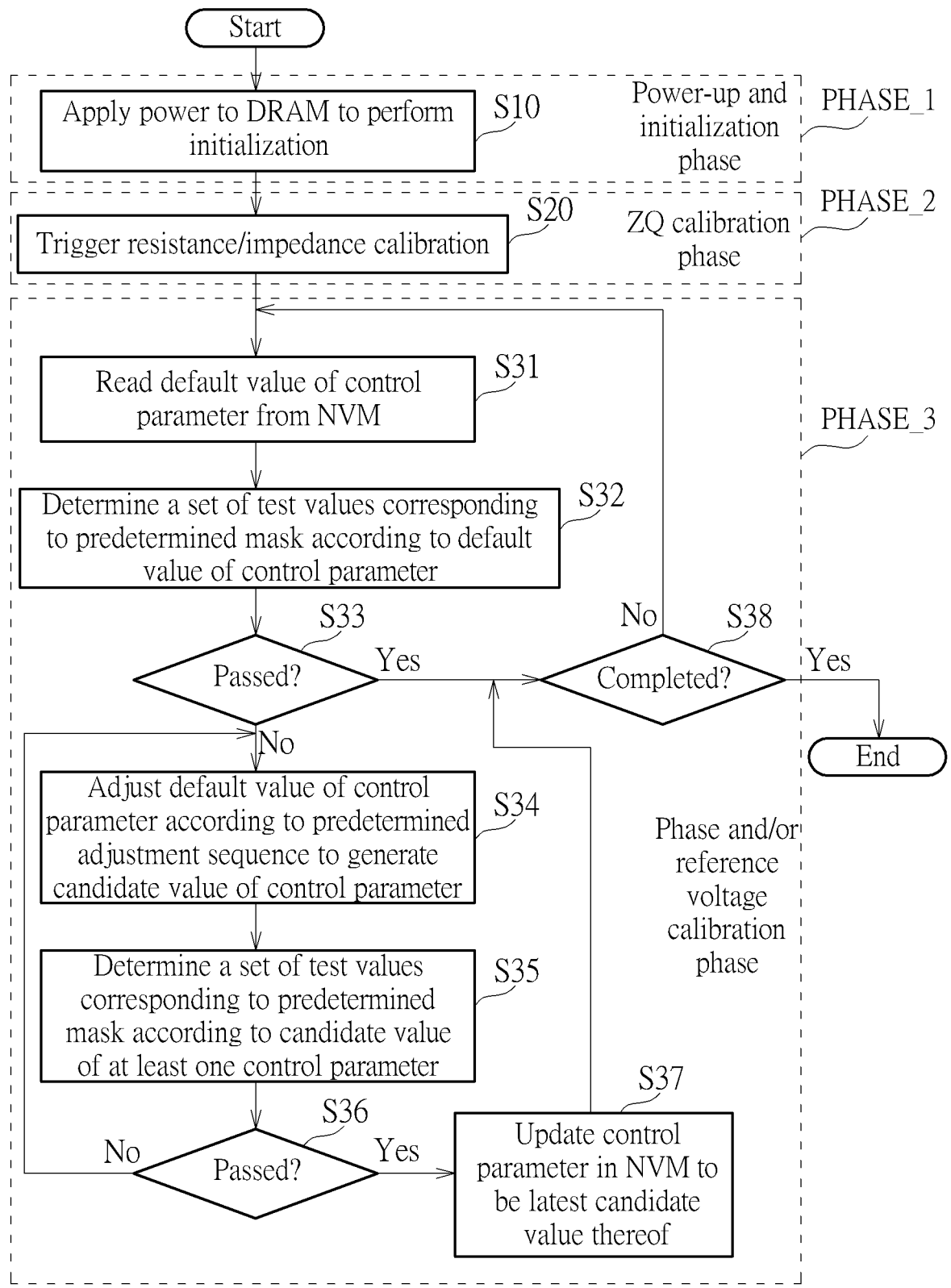
FIG. 10 illustrates a working flow of the method according to an embodiment of the present invention.

FIG. 10 illustrates a working flow of the method according to an embodiment of the present invention. The processing circuit 110 (e.g., the calibration control module 100C therein) can perform the operation of the Step S10, the operation of the Step S20 and the operations of the Steps S31-S38 in the power-up and initialization phase PHASE_1, the ZQ calibration phase PHASE_2, and the above-mentioned at least one subsequent phase such as the phase and/or reference voltage calibration phase PHASE_3, respectively. For better comprehension, Steps S31A-S37A, Steps S31B-S37B, and Steps S31C-S37C in some of the above embodiments can be taken as examples of the Steps S31-S37 in the working flow, respectively, but the present invention is not limited thereto. For example, in a situation where the respective default values of all control parameters are quite accurate to make the respective candidate positions (e.g., the respective candidate position counts thereof) of the calibration regarding reading and the calibration regarding writing be sufficient for dealing with any possible parameter drift, the processing circuit 110 (e.g., the calibration control module 100C therein) may execute at least one portion (e.g., a part or all) of Steps S31-S37 to perform and complete the calibration regarding reading, and then execute Step S38 to determine that it has not completed all calibrations (e.g., the calibration regarding reading and the calibration regarding writing), and execute at least one portion (e.g., a part or all) of Steps S31-S37 to perform and complete the calibration regarding writing, and subsequently execute Step S38 to determine that all the calibrations are completed.

In Step S10, the processing circuit 110 (e.g., the calibration control module 100C) can control the PHY circuit 120 to apply power to the DRAM 100D through the pad set 130 and to perform the initialization (e.g., the series of operations thereof) on the DRAM 100D.

In Step S20, the processing circuit 110 (e.g., the calibration control module 100C) can control the PHY circuit 120 to trigger the DRAM 100D through the pad set 130 to perform the resistance/impedance calibration.

In Step S31, the processing circuit 110 (e.g., the calibration control module 100C) can read at least one default value of at least one control parameter (such as the horizontal timing control parameter O_X and/or the reference voltage parameter O_Y) from the NVM 100N. For example, when the processing circuit 110 is performing the calibration regarding reading, the above-mentioned at least one control parameter may comprise the horizontal timing control parameter O_X(0) and the reference voltage parameter O_Y(0), and the above-mentioned at least one default value may comprise the default values (O_X0(0), O_Y0(0)). When the processing circuit 110 is performing the calibration regarding writing, for example, in a situation where the DRAM 100D belongs to DDR4 SDRAM, etc., the above-mentioned at least one control parameter may comprise the horizontal timing control parameter O_X(1) and the reference voltage parameter O_Y(1), and the above-mentioned at least one default value may comprise the default values (O_X0(1), O_Y0(1)); for another example, in a situation where the DRAM 100D is a DDR3 SDRAM, the at least one control parameter may comprise the horizontal timing control parameter O_X(1), and the at least one default value may comprise the default value O_X0(1).

In step S32, the processing circuit 110 (e.g., the calibration control module 100C) can determine a set of test values corresponding to a predetermined mask MASK according to the at least one default value of the at least one control parameter. For example, when the processing circuit 110 is performing the calibration regarding reading, the predetermined mask MASK may represent the predetermined mask MASK_A2D_Rx. When the processing circuit 110 is performing the calibration regarding writing, for example, in a situation where the DRAM 100D belongs to DDR4 SDRAM, etc., the predetermined mask MASK may represent MASK_A2D_Tx; for another example, in a case that the DRAM 100D belongs to DDR3 SDRAM, the predetermined mask MASK may represent the predetermined mask MASK_AB.

In step S33, the processing circuit 110 (for example, the calibration control module 100C) can check whether the test (for example: the read test such as the horizontal timing margin test, for the calibration regarding reading; or the write test, for the calibration regarding writing) is passed. If Yes, Step S38 is entered; If No, Step S34 is entered.

In Step S34, the processing circuit 110 (e.g., the calibration control module 100C) may adjust the default value of the at least one control parameter according to a predetermined adjustment sequence to generate at least one candidate value of the at least one control parameter. For example, when the processing circuit 110 is performing the calibration regarding reading, the above-mentioned at least one control parameter may comprise the horizontal timing control parameter O_X(0) and the reference voltage parameter O_Y(0), and the above-mentioned at least one candidate value may comprise the default value (O_Xc(0), O_Yc(0)). When the processing circuit 110 is performing the calibration regarding writing, for example, in a case that the DRAM 100D belongs to DDR4 SDRAM, etc., the above-mentioned at least one control parameter may comprise the horizontal timing control parameter O_X(1) and the reference voltage parameter O_Y(1), and the above-mentioned at least one candidate value may comprise the default values (O_Xc(1), O_Yc(1)); for another example, in a case that the DRAM 100D belongs to DDR3 SDRAM, the above-mentioned at least one control parameter may comprise the horizontal timing control parameter O_X(1), and the aforementioned at least one candidate value may comprise the default value O_Xc(1).

In Step S35, the processing circuit 110 may determine a set of test values corresponding to the predetermined mask MASK (e.g., one of the predetermined masks MASK_A2D_Rx, MASK_A2D_Tx, MASK_AB, etc., as described in Step S32) according to the at least one candidate value of the at least one control parameter.

In Step S36, the processing circuit 110 (e.g., the calibration control module 100C) may check whether the test (for example: the read test such as the horizontal timing margin test, for the calibration regarding reading; or the write test, for the calibration regarding writing) is passed. If Yes, Step S37 is entered; if No, Step S34 is entered.

In Step S37, the processing circuit 110 (e.g., the calibration control module 100C) may update the above-mentioned at least one control parameter in the NVM 100N to be the latest candidate value thereof.

In Step S38, the processing circuit 110 (e.g., the calibration control module 100C) can check whether all calibrations are completed. If Yes, the working flow comes to the end; if No, Step S31 is entered to perform the next calibration. For example, all calibrations may comprise the calibration regarding reading and the calibration regarding writing, and the processing circuit 110 may perform and complete the calibration regarding reading first. When Step S38 is executed for the first time, the processing circuit 110 may determine that it has not completed all calibrations. In this case, the next calibration may represent the calibration regarding writing. As a result, the processing circuit 110 can subsequently perform and complete the calibration regarding writing. When Step S38 is executed for the second time, the processing circuit 110 may determine that all calibrations have been completed. For brevity, similar descriptions for this embodiment are not repeated in detail here.

For better comprehension, the method can be illustrated by the working flow shown in FIG. 10, but the present invention is not limited thereto. According to some embodiments, one or more steps may be added, deleted, or changed in the working flow shown in FIG. 10. For example, one or more error handling steps may be inserted in the partial working flow from Step S36 to Step S34 (e.g., when the determination result of Step S36 is "No") for performing error handling. In the one or more error handling steps, the processing circuit 110 may first check whether the loop comprising Steps S34, S35, and S36 has used up all candidate positions among the multiple candidate positions of the center point O of the predetermined mask MASK, wherein, if this loop has used up all candidate positions (which means that the failure of the read test continues to occur until all candidate positions are used up), the processing circuit 110 can issue an error message and then execute step S38, otherwise, the processing circuit 110 can execute step S34 to continue the operations of this loop. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing memory calibration, applicable to a system on chip (SoC) integrated circuit (IC), the method comprising:
   in a power-up and initialization phase of the SoC IC, controlling a physical layer (PHY) circuit within the SoC IC to apply power to a memory through a pad set and perform initialization on the memory;
   in an impedance-calibration-related phase of the SoC IC, triggering the memory to perform impedance calibration regarding a set of data pins;
   in at least one subsequent phase of the SoC IC, during performing any calibration operation among a reading-related calibration operation and a writing-related calibration operation, performing a data access test corresponding to a set of test points on a predetermined mask, wherein the predetermined mask is movable with respect to a data eye, and possible positions of the predetermined mask relative to the data eye respectively correspond to multiple candidate positions of a center point of the predetermined mask; and
   according to whether the data access test is successful, selectively stopping the calibration operation;
   wherein the calibration operation is performed in at least one round, wherein the at least one round corresponds to at least one candidate position among the multiple candidate positions.

2. The method of claim 1, wherein the step of according to whether the data access test is successful, selectively stopping the calibration operation further comprises:
   according to whether the data access test is successful, selectively stopping the calibration operation to reduce total time of all calibration operations in the at least one subsequent phase.

3. The method of claim 1, wherein the step of according to whether the data access test is successful, selectively stopping the calibration operation further comprises:
   in response to the data access test being successful, stopping the calibration operation.

4. The method of claim 1, wherein the step of according to whether the data access test is successful, selectively stopping the calibration operation further comprises:
   in response to the data access test being unsuccessful, triggering continuing the calibration operation with the predetermined mask that has been moved.

5. The method of claim 1, wherein the step of according to whether the data access test is successful, selectively stopping the calibration operation further comprises:
   in response to the data access test being successful, stopping the calibration operation in a current round, or, in response to the data access test being unsuccessful, triggering the calibration operation in another round.

6. The method of claim 1, wherein success of the data access test on the set of test points indicates that the data access test on all possible test points in a region enclosed by the predetermined mask is expected to be successful.

7. A system on chip (SoC) integrated circuit (IC), equipped with a memory calibration function, the SoC IC comprising:
   a processing circuit, configured to control operations of the SoC IC;
   a physical layer (PHY) circuit, coupled to the processing circuit, configured to communicate with a memory for the processing circuit; and
   a pad set, comprising a plurality of pads as terminals of the SoC IC for coupling the SoC IC to at least one external component, wherein the at least one external component comprises the memory;
   wherein:
   in a power-up and initialization phase of the SoC IC, the processing circuit controls the PHY circuit within the SoC IC to apply power to the memory through the pad set and perform initialization on the memory;
   in an impedance-calibration-related phase of the SoC IC, the processing circuit triggers the memory to perform impedance calibration regarding a set of data pins;
   in at least one subsequent phase of the SoC IC, during performing calibration operation among a reading-related calibration operation and a writing-related calibration operation, the processing circuit performs a data access test corresponding to a set of test points on a predetermined mask, wherein the predetermined mask is movable with respect to a data eye, and possible positions of the predetermined mask relative to the data eye respectively correspond to multiple candidate positions of a center point of the predetermined mask; and
   according to whether the data access test is successful, the processing circuit selectively stops the calibration operation;
   wherein the calibration operation is performed in at least one round, wherein
   the at least one round corresponds to at least one candidate position among the multiple candidate positions.

8. A non-transitory computer-readable medium, the non-transitory computer-readable medium storing a program code which causes a system-on-chip (SoC) integrated circuit (IC) to perform a memory calibration procedure when executing the program code, the memory calibration procedure comprising:
   in a power-up and initialization phase of the SoC IC, controlling a physical layer (PHY) circuit within the SoC IC to apply power to a memory through a pad set and perform initialization on the memory;
   in an impedance-calibration-related phase of the SoC IC, triggering the memory to perform impedance calibration regarding a set of data pins;
   in at least one subsequent phase of the SoC IC, during performing calibration operation among a reading-related calibration operation and a writing-related calibration operation, performing a data access test corresponding to a set of test points on a predetermined mask, wherein the predetermined mask is movable with respect to a data eye, and possible positions of the predetermined mask relative to the data eye respectively correspond to multiple candidate positions of a center point of the predetermined mask; and
   according to whether the data access test is successful, selectively stopping the calibration operation;
   wherein the calibration operation is performed in at least one round,
   wherein the at least one round corresponds to at least one candidate position among the multiple candidate positions.

* * * * *